US009172400B2

(12) United States Patent
Jin (10) Patent No.: US 9,172,400 B2
(45) Date of Patent: Oct. 27, 2015

(54) ENCODING TECHNIQUES USING MULTIPLE CODING STRENGTHS WITHIN A SINGLE LDPC CODE WORD (71) Applicant: Cisco Technology, Inc., San Jose, CA (US)

(72) Inventor: Hang Jin, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 223 days.

(21) Appl. No.: 13/904,094

(22) Filed: May 29, 2013

(65) Prior Publication Data
US 2014/0359390 A1 Dec. 4, 2014

(51) Int. Cl.
H03M 13/11 (2006.01)
H03M 13/25 (2006.01)
H04L 1/00 (2006.01)
H03M 13/35 (2006.01)

(52) U.S. Cl.
CPC ........ *H03M 13/1148* (2013.01); *H03M 13/255* (2013.01); *H03M 13/356* (2013.01); *H04L 1/007* (2013.01); *H04L 1/0041* (2013.01); *H04L 1/0058* (2013.01)

(58) Field of Classification Search
CPC ............ H03M 13/255; H03M 13/1148; H04L 1/0041; H04L 1/007; H04L 1/0058
USPC .................. 714/752, 755, 786, 774
See application file for complete search history.

(56) References Cited

U.S. PATENT DOCUMENTS

| 8,050,622 | B2 | 11/2011 | Hedayat et al. | |
|---|---|---|---|---|
| 8,121,020 | B1* | 2/2012 | von der Embse | 370/206 |
| 2008/0320355 | A1 | 12/2008 | Lou et al. | |
| 2010/0260240 | A1* | 10/2010 | Wang | 375/214 |
| 2013/0091086 | A1* | 4/2013 | Hively | 706/50 |

FOREIGN PATENT DOCUMENTS

EP 2306653 A1 4/2011

OTHER PUBLICATIONS

Sankar et al., "Design of Low-Density Parity-Check (LDPC) Codes for High Order Constellations", Global Telecommunications Conference, GLOBECOM 2004, Nov. 29, 2014, pp. 3113-3117.*
Rahnavard et al., "New Results on Unequal Error Protection Using LDPC Codes", IEEE Communications Letters, vol. 10, No. 1, Jan. 1, 2006, pp. 43-45.
Sandberg et al., "Design of Bandwidth-Efficient Unequal Error Protection LDPC Codes", IEEE Transactions on Communications, vol. 58, No. 3, Mar. 1, 2010, pp. 802-811.
Wu et al., "A New Construction of UEP QC-LDPC Codes", IEEE International Symposium on Information Theory, Jun. 13, 2010, pp. 849-853.

(Continued)

*Primary Examiner* — Guy Lamarre
(74) *Attorney, Agent, or Firm* — Edell, Shapiro & Finnan, LLC (57) ABSTRACT Techniques are presented herein to encode information bits. The information bits are partitioned into at least two groups based on inherent reliability and immunity to channel impairments of the respective bits. Each of the groups of information bits is encoded with a different coding strength. The resulting code word may be stored in a storage media or transmitted in a communication channel.

20 Claims, 8 Drawing Sheets (56) References Cited

OTHER PUBLICATIONS

Masnick et al., "On Linear Unequal Error Protection Codes", IEEE Transactions on Information Theory, vol. 13, No. 4, Oct. 1, 1967, pp. 600-607.

Poulliat et al., "Enhancement of Unequal Error Protection Properties of LDPC Codes", EURASIP Journal on Wireless Communications and Networking, vol. 2007, No. 1, Jan. 1, 2007, 9 pages.

Liva et al., "Design of LDPC Codes: A Survey and New Results", Sep. 1, 2006, retrieved from the internet on Mar. 11, 2013, http://citeseerx.ist.psu.edu/viewdoc/download?doi=10.1.1.125.2561&rep=rep1&type=pdf, 22 Pages.

International Search Report and Written Opinion in counterpart International Application No. PCT/US2014/039675, mailed Aug. 29, 2014, 14 pages.

\* cited by examiner

ENCODING TECHNIQUES USING MULTIPLE CODING STRENGTHS WITHIN A SINGLE LDPC CODE WORD

TECHNICAL FIELD

The present disclosure relates to encoding techniques for communication and data storage applications.

BACKGROUND

Low density parity check (LDPC) coding techniques are gaining increasing popularity, and have been accepted for numerous communication standards, e.g., IEEE 802.11 (Wi-Fi™) WiMAX™, Long Term Evolution (LTE), Digital Video Broadcast (DVBc2), Data Over Cable Service Interface Specification (DOCSIS3.1), etc.

LDPC coding is a type of block coding. On the encode side, an encoder adds m parity (redundant) bits to every k information bits to form n=k+m coded bits. On the decode side, a decoder extracts k information bits from n coded bits using m parity check equations. The code rate is defined as k/n.

LDPC coding, like all forward error correction (FEC) coding techniques, uses extra information carried in the redundant bits to recover the lost or damaged information bits. In other words, an LDPC code word sends more "information" than the original information bits and "inter-connects" the original information with the redundancy information so that the decoder can recover lost or damaged original information bits. The recovery ability of the coding used is defined as the coding strength.

DESCRIPTION OF EXAMPLE EMBODIMENTS

Overview

Techniques are presented herein to encode information bits. The information bits are partitioned into at least two groups based on inherent reliability and immunity to channel impairments of the respective bits. Each of the groups of information bits is encoded with a different coding strength/rate. The resulting code word may be stored in a storage media or transmitted in a communication channel.

Example Embodiments

Current low density parity check (LDPC) coding techniques apply the same coding strength equally to all the information bits. That is, a single code rate is used for all the information bits contained in a code word.

Presented herein are coding techniques in which different coding strengths/rates are applied to different information bits, based on the inherent reliability and immunity to channel impairments of the respective information bits. Multiple coding strengths/rates are used within a single LDPC code word. Advantages of this multi-coding strength/rate LDPC code word include better coding gain and less coding overhead.

Information bits are used to represent data for storage in a data storage device or medium, or for communication in a communication channel. Generally, each of the information bits does not have equal reliability or immunity to channel impairments. For example, in communication applications, bits are mapped to symbols and the bit-to-symbol mapping is "un-equal", resulting in differences in reliability and immunity to channel impairments. An example of this unequal bit-to-symbol mapping is described hereinafter in connection with FIG. 7.

Applying the same coding strength (coding rate) to all the information bits does not provide equal error correction capability to all the information bits because the bits inherently have different reliabilities (different coding requirements). This contradicts the purpose of coding, i.e., "averaging" the reliabilities of all bits so that lost or damaged bits can be recovered.

Accordingly, a coding scheme is presented herein in which different coding strengths are applied to different groups of the information bits within a single code word (e.g., a single LDPC code word), depending on the inherent reliability and immunity of the information bits to channel impairments, such as impairments in a communication channel or impairments associated with a particular storage device or storage media. The code word is constructed from multiple component code words encoded with different coding strengths (coding rates), with intra-branches connecting the multiple code words together. The intra-branches are structured to meet certain code performance criteria (e.g., the girth of the composite code satisfying predetermined criteria).

There are several advantages to this LDPC coding scheme. First, it has reduced complexity. Some of the information bits can be coded with a much higher code rate, leading to fewer computations. Second, it has better coding gain. The inherent reliability of the bits is factored in the code structure, achieving improved coding gain in the resulting code word. Third, it enjoys less coding overhead. Some of the bits are coded with a higher code rate, such that the overall coding rate is increased, resulting in reduced coding overhead.

Figure 1:
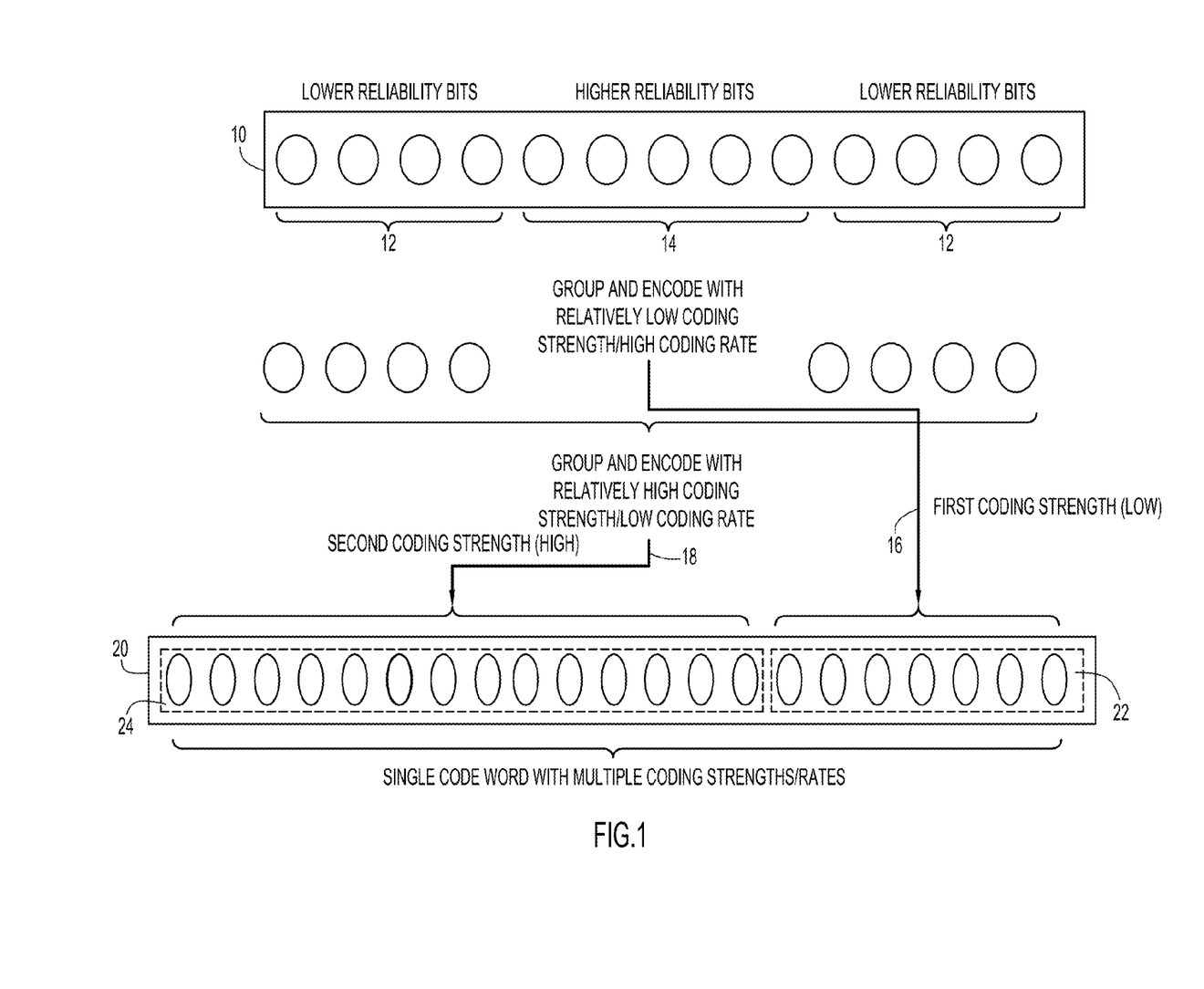
FIG. 1 is a diagram pictorially illustrating the coding techniques presented herein.

Referring now to FIG. 1, a diagram is shown that pictorially depicts the coding scheme according to these techniques. In FIG. 1, a string of information bits is shown at reference numeral 10. This string of bits 10 is to be encoded for storage or communication in a communication channel. In the string of information bits 10, some of the bits are inherently less reliable or more susceptible to channel impairments, and these bits are shown at reference numeral 12. Conversely, other bits in the string 10 are inherently more reliable and less susceptible to channel impairments, and these bits are shown at reference numeral 14. The higher reliability bits 14 are grouped together and encoded with a lower coding strength/ higher coding rate as shown at reference numeral 16. The lower reliability bits 12 are grouped together and encoded with a higher coding strength/lower coding rate as shown at reference numeral 18. The resulting code word 20 thus includes a first plurality of bits 22 for a first component code word resulting from encoding of the higher reliability bits 14 with a lower coding strength/higher coding rate, and a second plurality of bits 24 for a second component code word resulting from encoding of the lower reliability bits 12 with a higher coding strength/lower coding rate. The code word 20 is a single code word with multiple coding strengths/rates, that is, with two (or more) inter-connected component code words, each of which is encoded with a different coding strength. The number of bits shown in the example of FIG. 1 is not meant to be limiting, but solely for illustrative purposes of the general concepts of the coding techniques presented herein.

Figure 2A:
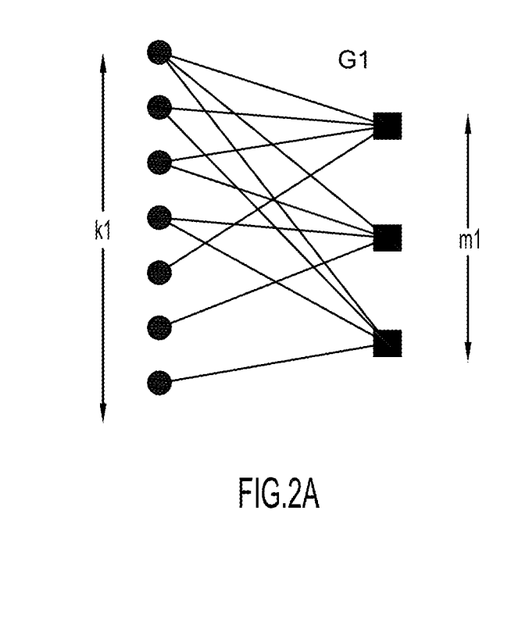
FIGS. 2A and 2B are Tanner graphs of two example codes that are used in a combined single code word according to techniques presented herein.
Figure 2B:
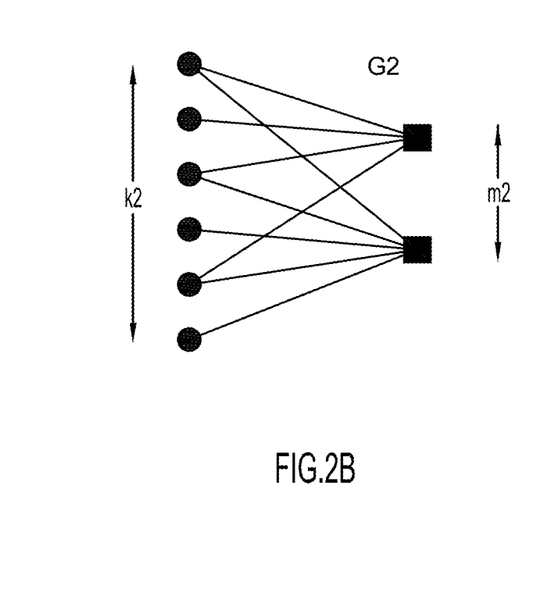

Reference is now made to FIGS. 2A and 2B. The diagrams shown in these figures are called Tanner graphs. A Tanner graph is a graphic representation of an LDPC parity check matrix, and is used extensively for LDPC encoding/decoding. A Tanner graph consists of two columns of nodes, the left column consists of variable nodes representing information bits, and the right column consists of the check nodes representing the constraints (parity check equations) or redundancy bits. In an example where the number of variable nodes=k, and the number of check nodes=m, the coding rate=k/(k+m).

FIG. 2A shows the Tanner graph G1 for a first code C1, where C1(n1, k1, m1=n1−k1) and FIG. 2B shows the Tanner graph G2 for a second code C2, where C2(n2, k2, m2=n2−k2). The number of nodes shown in FIGS. 2A and 2B are for illustration purposes only and not meant to indicate precisely the actual number of information nodes and checking nodes used in the encoder and decoder, nor meant to be precisely indicative of the coding rates used in the examples shown in FIGS. 2A and 2B. The coding rate for code C1 is CR1=k1/n1 and the coding rate C2 is CR2=k2/n2, respectively. In these examples, CR1>CR2, meaning code C2 is stronger than code C1. The coding rate is defined as k/n, k is the number of information bits, and n is the number of coded bits. The higher the coding rate, the less parity bits in the code, so the weaker the coding strength, and vice versa. Coding strength is inversely proportional to code/coding rate. The Tanner graphs for codes C1 and C2 shown in FIGS. 2A and 2B are used hereinafter to describe the coding scheme to code information bits into a single multiple coding strength code word.

Figure 3:
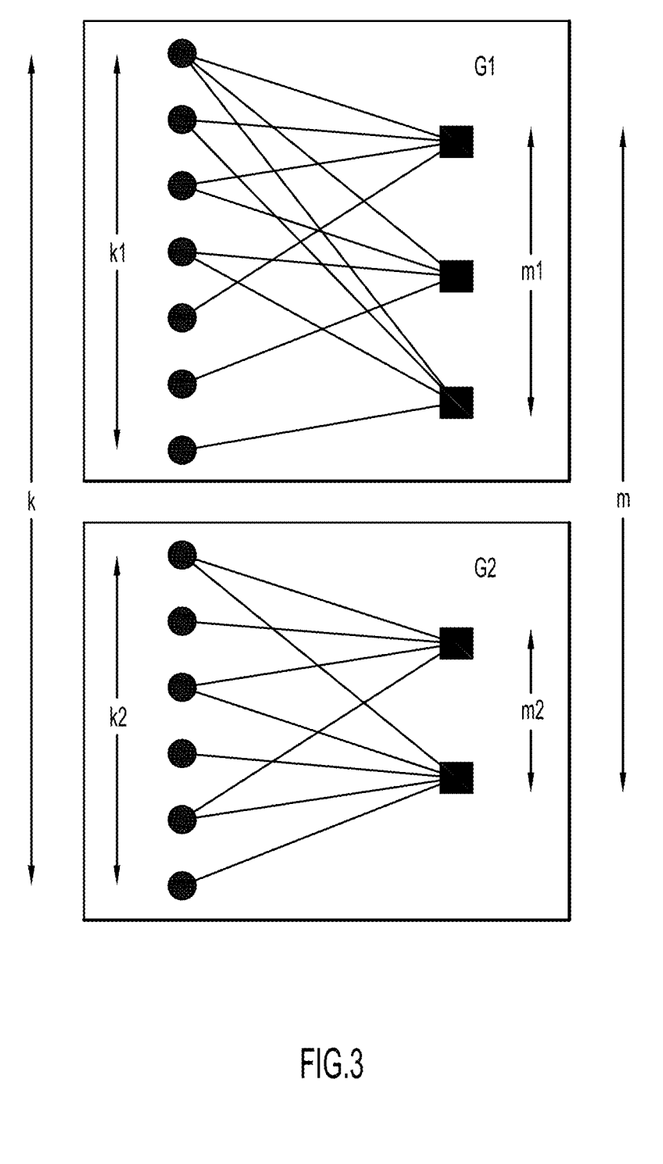
FIG. 3 illustrates a combination/parallelizing of the Tanner graphs of FIGS. 2A and 2B.

FIG. 3 illustrates the combining/parallelizing of the Tanner graphs G1 and G2 for codes C1 and C2 to construct a larger Tanner graph G which has k=k1+k2 variable nodes, and m=m1+m2 check nodes for a composite code word. In the combined Tanner graph G, the codes C1 and C2 are referred to as component codes or component code words.

Figure 4:
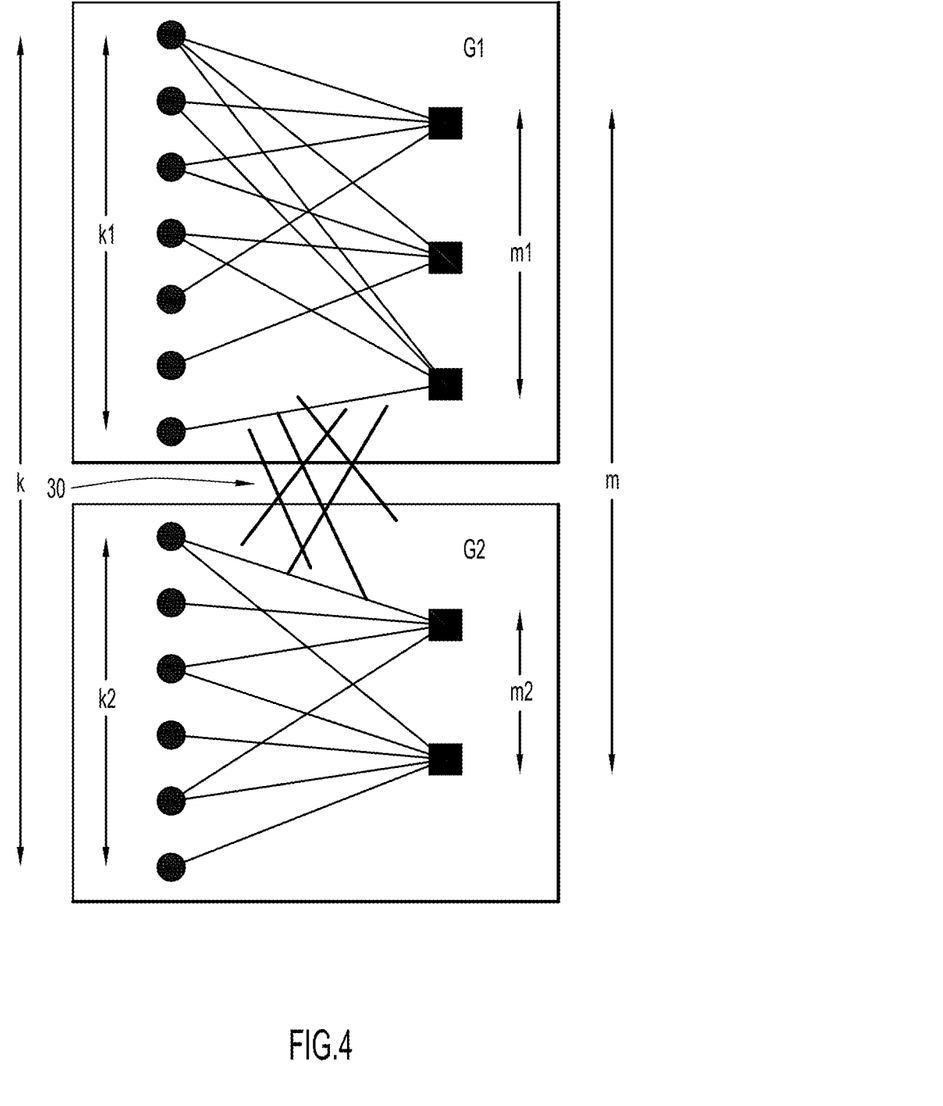
FIG. 4 is a diagram similar to FIG. 3, but showing cross branches connected between the two Tanner graphs of FIGS. 2A and 2B.

Next, in FIG. 4, branches are placed between the Tanner graphs G1 and G2 for codes C1 and C2. These branches are shown at reference numeral 30 and are referred to as cross branches. The number, L, of these cross branches may be determined by the "degrees" of the Tanner graphs G1 and G2. For example, L=max(D1, D2), where D1 and D2 are the average degrees of the Tanner graphs G1 and G2, respectively. The "degrees" refers to the number of connections from the k nodes (representing the information bits) to the m check nodes (representing the redundancy or check bits).

Figure 5:
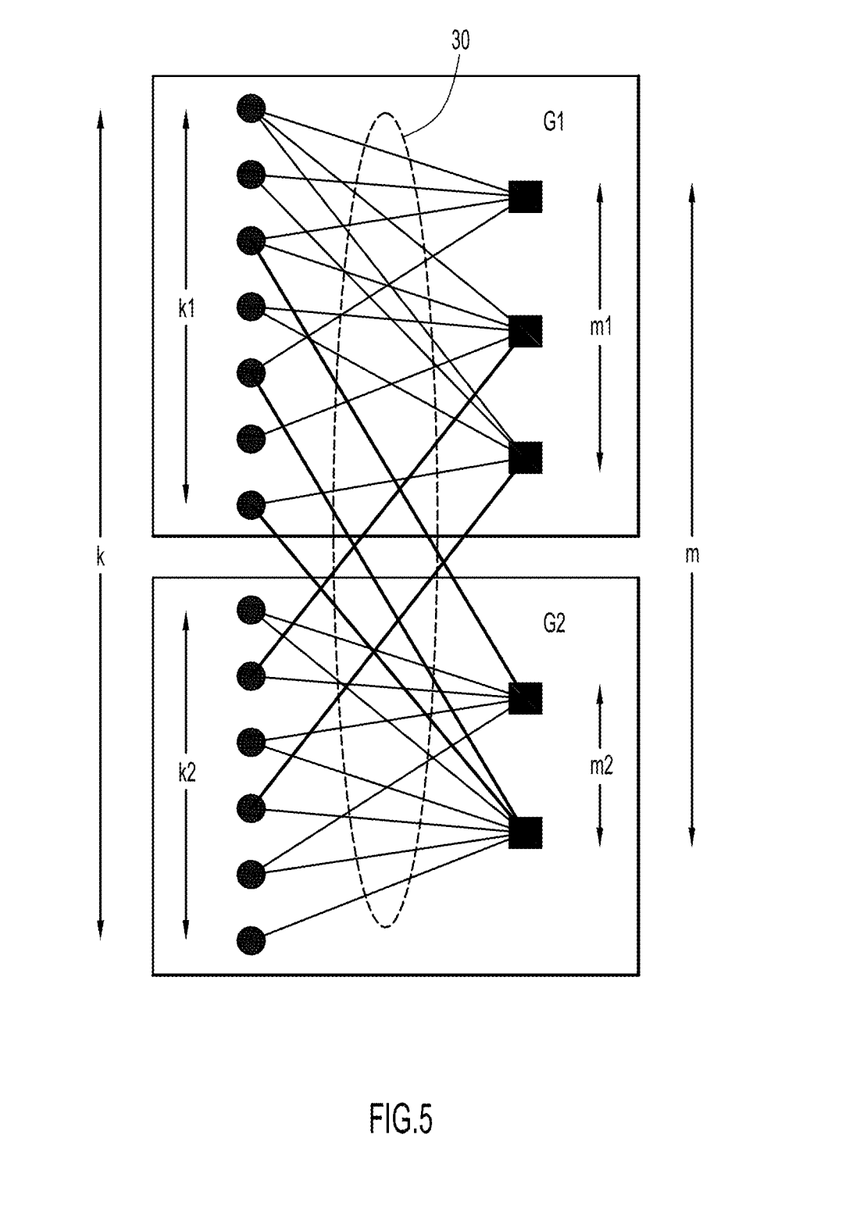
FIG. 5 is a diagram showing in more detail the placement of the cross branches between the two Tanner graphs of FIGS. 2A and 2B.

Turning now to FIG. 5, a diagram is provided that shows the connection of the cross branches 30 between the Tanner graphs G1 and G2. A procedure to connect the cross branches to the variable and check nodes is described as follows.

1. A first cross branch is connected to the first variable node in Tanner graph G1.
2. The selected cross branch is connected to the first check node of Tanner graph G2.
3. A minimum girth value of the composite Tanner graph G with the added cross branch is computed. The girth of a code is the length of the shortest cycle in its Tanner graph. As is known in the art, a "cycle" refers to the sum of all paths from a starting point node back to that same node after passing through information nodes and checking nodes.
4. If the minimum girth satisfies predetermined criteria, the next cross branch is selected and the process is repeated at operation 1. Otherwise, a different pair is selected, the pair being either a variable node of G1 and a check node of G2, or a variable node of G2 and a check node of G1, and the process goes to operation 3. For example, the predetermined criteria may be that the minimum girth is 3.
5. The process stops if all the cross branches are connected. If not, the minimum girth criteria (reduce the requirement) is changed or a different component code C1 and C2 is selected.

To summarize, cross branches between the Tanner graph representations for component code words (associated with different coding strengths/rates) are computed, where the number of cross branches is based on the average degrees of the Tanner graph representations of each of the code words. The cross branches are computed so that the resulting single code word, which is a composite of the component code words, has a girth that satisfies predetermined criteria.

Figure 6:
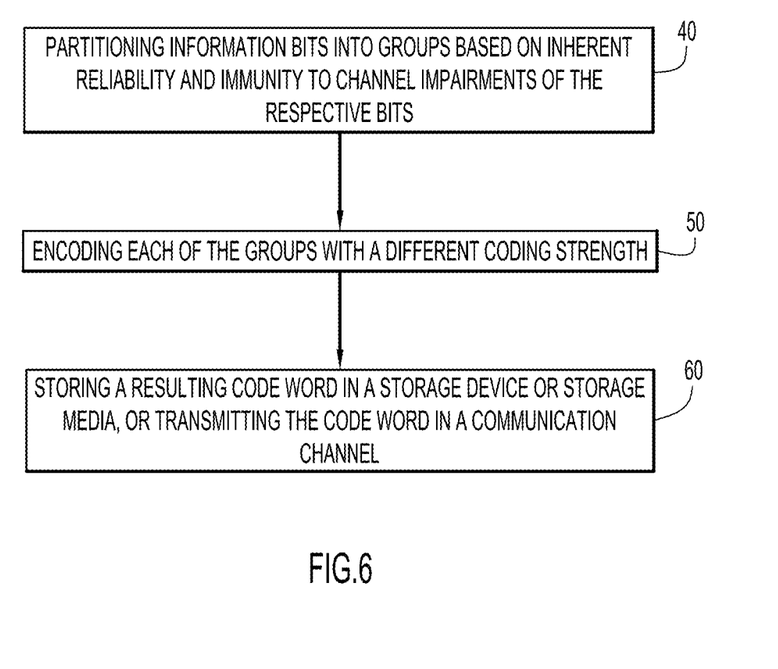
FIG. 6 is a flow chart depicting operations to encode information bits according to the techniques presented herein.

Reference is now made to FIG. 6 for a description of a flow chart depicting operations of an encoding process according to the techniques presented herein. Reference is also made to FIG. 5 for this description. At 40, information bits to be encoded are partitioned into (at least two) groups based on inherent reliability and immunity to channel impairments of the respective bits. For example, as shown in FIG. 5, k information bits are partitioned into two groups with information bits k1 and k2, respectively, such that k1+k2=k. The partitioning is done in such a way that the k1 bits are inherently more reliable than the k2 bits.

At 50, each of the groups of information bits is encoded with a different coding strength/rate. For example, in FIG. 5, k1 bits are mapped onto the variable nodes in the Tanner graph G1 according to code strength/rate CR1, and the k2 bits are mapped onto the variable nodes in Tanner graph G2 according to code strength/rate CR2. The actual implementation of this mapping may be done through the corresponding composite parity check matrix. The coding rates are CR1 for the k1 bits, and CR2 for the k2 bits, respectively. The effective coding rate will be (k1+k2)/(n1+n2). Again, in this example, the CR1>CR2.

At 60, the resulting code word is stored in a storage device or storage media, or transmitted in a communication channel to one or more destination devices. It should be appreciated that, in practice, the coding scheme is performed for large blocks of bits in order to encode a large number of bits into a plurality of code words representing the original information bits, for storage or transmission in a communication channel.

Figure 7:
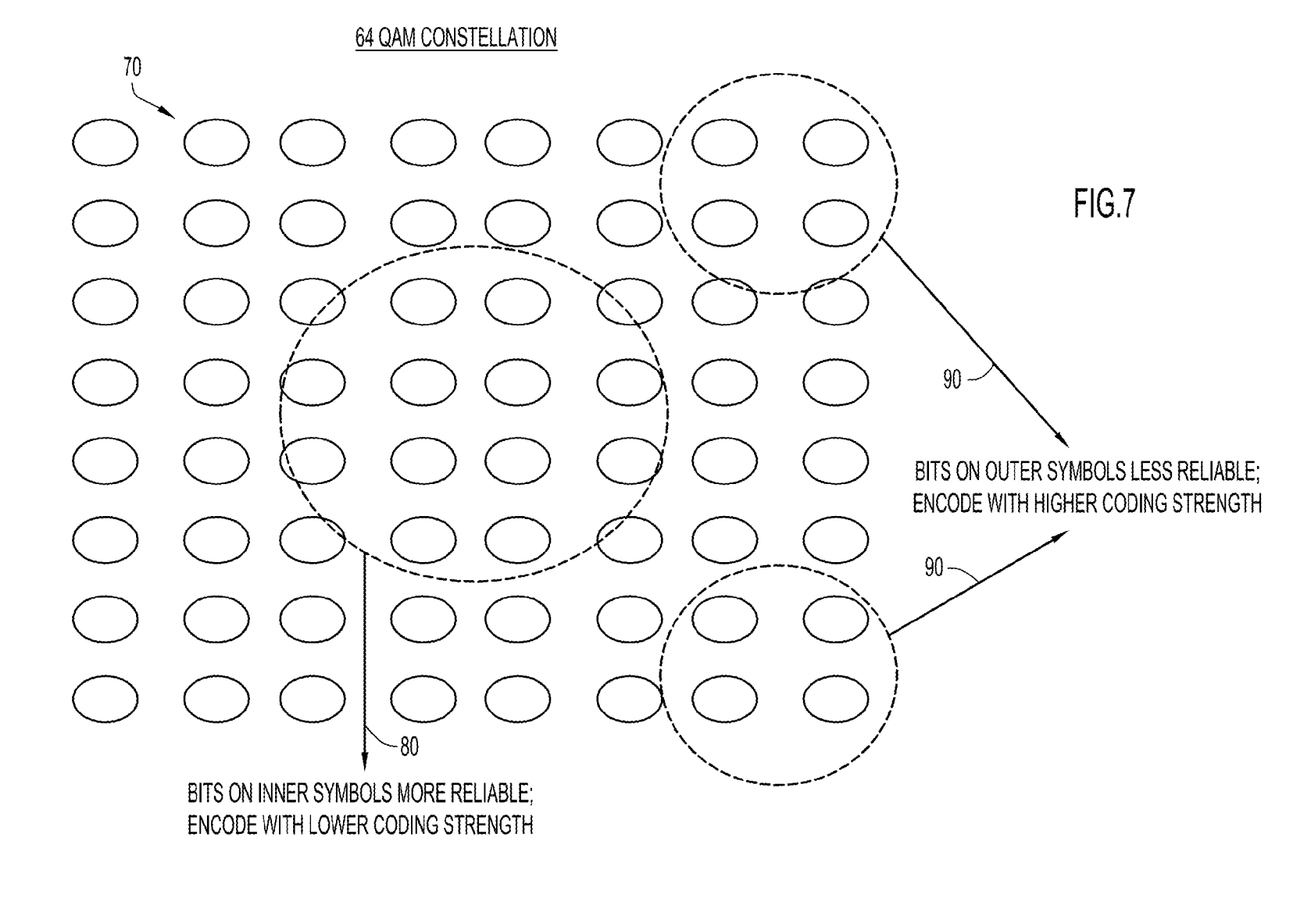
FIG. 7 is a diagram illustrating an example of a symbol constellation in which bits for different positions in the symbol constellation are grouped and encoded with different coding strengths.

Turning to FIG. 7, a diagram is shown for an example application of the coding techniques presented herein. In this example, a 64 Quadrature Amplitude Modulation (QAM) symbol constellation 70 is shown. As indicated in the figure, at 80, the bits for the inner symbols of the constellation are more reliable and can be encoded with a relatively lower coding strength/higher coding rate. On the other hand, the bits for the outer symbols shown at 90 are less reliable and are encoded with a relatively higher coding strength/lower coding rate.

The encoding scheme dictates the decoding process. The decoding process takes in the coded bits, and uses the composite parity check matrix (the composited Tanner graph) to decode the bits, without the need to know explicitly how the parity check parity matrix is constructed and why it is constructed in such a way. Generally, decoding code words encoded according to the encoding scheme presented herein involves receiving a code word that includes two (or more) inter-connected component code words, each encoded with a different coding strength. The inter-connected component code words are jointly decoded according to their corresponding coding strengths to recover all the information bits for all the component code words.

Figure 8:
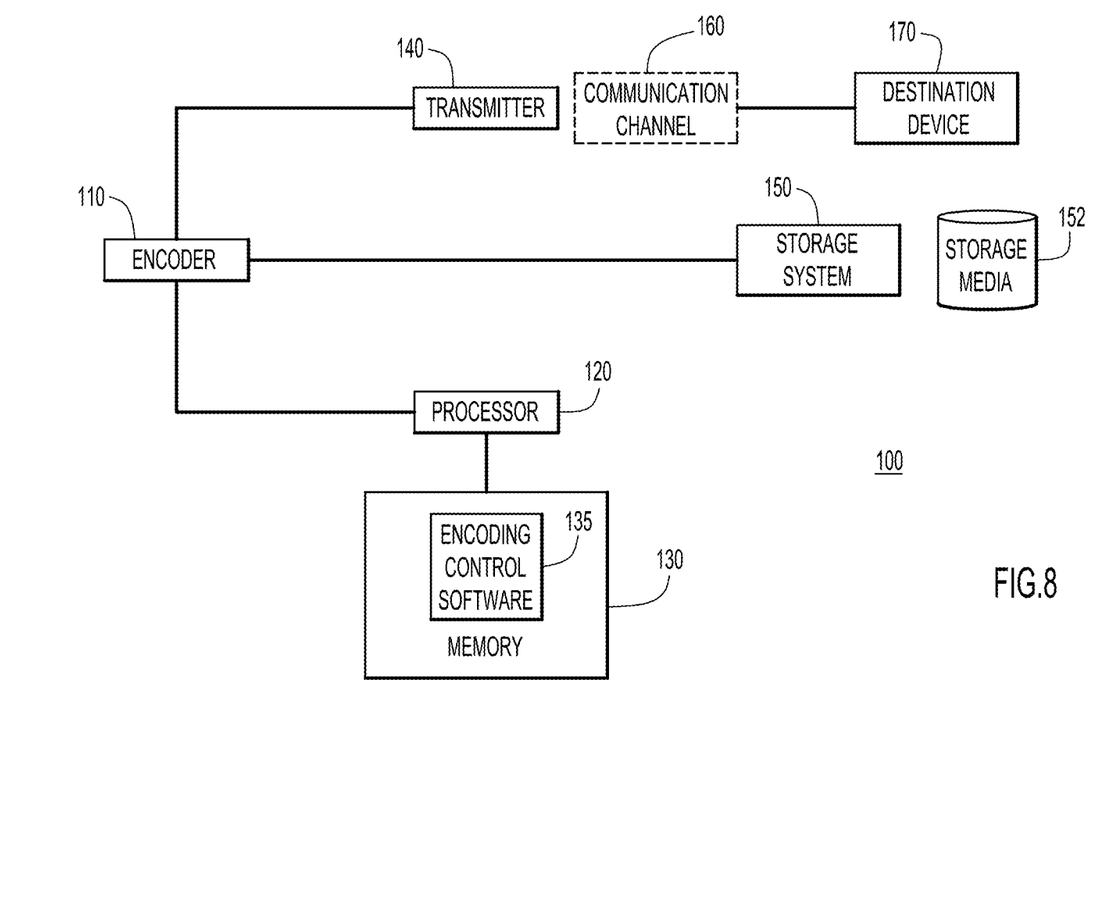
FIG. 8 is a block diagram of a device configured to encode information bits according to the techniques presented herein.

Referring now to FIG. 8, an example block diagram is shown for a device in which the coding techniques presented herein may be used. As explained above, the coding techniques may be employed in a device that encodes information for storage in a storage media or device or for transmission across a communication channel. FIG. 8 shows a device 100 comprising an encoder 110, a processor or central processing unit (CPU) 120, memory 130 in which is stored encoding control software 135, transmitter 140, and storage system 150. The encoder 110 is a hardware block that is configured to perform the encoding operations described herein to encode information bits into code words. For example, the encoder 110 may be implemented in digital logic gates in one or more application specific integrated circuits (ASICs) or in a programmable logic device configured to perform the encoding operations presented herein.

The processor 120 may be a microcontroller or microprocessor that executes instructions stored/encoded in memory 130 for the encoding control software 135 in order to facilitate one or more of the encoding operations described herein in connection with the encoder, or to perform the entirety of the encoding process described herein. For example, the processor 120 may supply the information bits to be encoded to the encoder 110. The processor 120 may also perform the bit-to-symbol mapping prior to supplying the information bits to the encoder. The encoding operations described herein may be performed partially in hardware and partially in software, entirely in hardware or entirely in software.

The transmitter 140 may be a wired or wireless transmitter that is configured to format and transmits the code words over communication channel 160 to a destination device 170. For example, the transmitter 140 may be configured to send data over a wired or wired network.

The storage system 150 may be a memory writing subsystem that writes data for storage in a data storage media or device, such as the storage device 152 shown in FIG. 8. An example of storage device 152 is an optical compact disk, Universal Serial Bus (USB) disk drive, magnetic hard disk drive, etc.

The memory 130 may comprise read only memory (ROM), random access memory (RAM), magnetic disk storage media devices, optical storage media devices, flash memory devices, electrical, optical, or other physical/tangible memory storage devices. In general, the memory 130 may comprise one or more tangible (non-transitory) computer readable storage media (e.g., a memory device) encoded with software comprising computer executable instructions and when the software is executed (by the processor 120) it is operable to perform the operations described herein.

To summarize, encoding techniques are presented herein in which information bits are partitioned into groups based on their inherent reliability and immunity to channel impairments, and different groups are encoded with different coding strengths (coding rates) with a single LDPC code word that supports multiple coding rates.

Multiple coding rates are supported within a single LDPC code word in accordance with these techniques. The LDPC code applies different coding strengths (coding rates) for different groups of information bits within a single code word. As described herein, a LDPC code word may be constructed from multiple shorter code words (component code words) with a different coding strength by parallelizing Tanner graph representations of each of the component code words. The LDPC code word is constructed from multiple shorter code words with different coding strengths/rates by adding cross branches between the Tanner graph representations for the shorter code words. The branches may be added in such a way that the girth of the composite code satisfies a predetermined requirement or criteria.

In summary, a method is provided comprising, at a device having information bits to be stored in a storage media or transmitted in a communication channel, partitioning the information bits into at least two groups based on inherent reliability and immunity to channel impairments of the respective bits; and encoding each of the groups of information bits with a different coding strength.

Similarly, in another form, one or more computer readable storage media is provided which is encoded with software comprising computer executable instructions and when the software is executed operable to: partition information bits to be stored in a storage media or transmitted in a communication channel into at least two groups based on inherent reliability and immunity to channel impairments of the respective bits; and encode each of the groups of information bits with a different coding strength.

Furthermore, an apparatus is provided comprising an encoder; and a processor coupled to the encoder and configured to supply information bits to the encoded; wherein the encoder is configured to: partition the information bits into at least two groups based on inherent reliability and immunity to channel impairments of the respective bits; and encode each of the groups of information bits with a different coding strength.

Described above are examples. The concepts described herein may be embodied in other specific forms without departing from the spirit or essential characteristics thereof. The foregoing examples are therefore to be considered in all respects illustrative and not meant to be limiting. Accordingly, it is intended to embrace all such alterations, modifications and variations that fall within the spirit and scope of any claims filed in applications claiming priority hereto interpreted in accordance with the breadth to which they are fairly, legally and equitably entitled.

What is claimed is:

1. A method comprising:
at a device having information bits to be stored in a storage media or transmitted in a communication channel, partitioning the information bits into at least two groups based on inherent reliability and immunity to channel impairments of the respective bits; and
encoding each of the groups of information bits with a different coding strength;
parallelizing Tanner graph representations of each of the groups of information bits to generate a composite Tanner graph representation;

computing a number for cross branches between the groups of information bits based on average degrees of Tanner graph representations of each of the groups of information bits; and constructing each cross branch by:
  connecting a first variable node of a first group of the at least two groups and a first check node of a second group of the at least two groups;
  computing a minimum girth of the composite Tanner graph representation;
  when the computed minimum girth of the composite Tanner graph representation satisfies a predetermined criteria, proceeding to construct a next cross branch; and
  when the computed minimum girth of the composite Tanner graph representation exceeds the predetermined criteria, proceeding to connecting a different pair of variable node of the first group and check node of the second group and computing the minimum girth again until the predetermined criteria is satisfied.

2. The method of claim 1, wherein encoding comprises encoding information bits for a low density parity code word such that a different coding strength is applied to different groups of information bits within a single code word.

3. The method of claim 1, wherein encoding comprises encoding the information groups into a single low density parity code word that supports multiple coding strengths.

4. The method of claim 1, wherein encoding comprises encoding a group of information bits having a relatively low reliability and immunity to channel impairments with a relatively higher coding strength and encoding a group of information bits having a relatively high reliability and immunity to channel impairments with a relatively lower coding strength.

5. The method of claim 1, further comprising storing a resulting code word in a storage media or transmitting the code word in a communication channel.

6. The method of claim 1, further comprising adjusting the predetermined criteria when a cross branch exceeds the predetermined criteria after iterating over all potential variance node and check node pairs.

7. The method of claim 1, wherein the at least two groups comprise three or more groups, and the method further comprising selecting a different pair of groups of the three or more groups to construct the cross branches when a cross branch exceeds the predetermined criteria after iterating over all potential variance node and check node pairs of the first and second groups.

8. The method of claim 1, wherein the groups of information bits are modulated according to a 64 Quadrature Amplitude Modulation (QAM) symbol constellation, and at least one group of information bits correspond to inner symbols of the QAM symbol constellation and at least another group of information bits correspond to outer symbols of the QAM symbol constellation.

9. One or more non-transitory computer readable storage media encoded with software comprising computer executable instructions and when the software is executed operable to:
  partition information bits to be stored in a storage media or transmitted in a communication channel into at least two groups based on inherent reliability and immunity to channel impairments of the respective bits;
  encode each of the groups of information bits with a different coding strength;
  parallelize Tanner graph representations of each of the groups of information bits to generate a composite Tanner graph representation;
  compute a number for cross branches between the groups of information bits based on average degrees of Tanner graph representations of each of the groups of information bits; and
  construct each cross branch by:
    connecting a first variable node of a first group of the at least two groups and a first check node of a second group of the at least two groups;
    computing a minimum girth of the composite Tanner graph representation;
    when the computed minimum girth of the composite Tanner graph representation satisfies a predetermined criteria, proceeding to construct a next cross branch; and
    when the computed minimum girth of the composite Tanner graph representation exceeds the predetermined criteria, proceeding to connect a different pair of a variable node of the first group and a check node of the second group and computing the minimum girth again until the predetermined criteria is satisfied.

10. The non-transitory computer readable storage media of claim 9, wherein the instructions operable to encode comprise instructions operable to encode the information bits for a low density parity code word such that a different coding strength is applied to different groups of information bits within a single code word.

11. The non-transitory computer readable storage media of claim 9, wherein the instructions operable to encode comprise instructions operable to encode the information groups into a single low density parity code word that supports multiple coding strengths.

12. The non-transitory computer readable storage media of claim 9, wherein the instructions operable to encode comprise instructions operable to encode a group of information bits having a relatively low reliability and immunity to channel impairments with a relatively higher coding strength and encode a group of information bits having a relatively high reliability and immunity to channel impairments with a relatively lower coding strength.

13. The non-transitory computer readable storage media of claim 9, wherein the software further comprises computer executable instructions that when the software is executed operable to adjust the predetermined criteria when a cross branch exceeds the predetermined criteria after iterating over all potential variance node and check node pairs.

14. The non-transitory computer readable storage media of claim 9, wherein the at least two groups comprise three or more groups, and the software further comprises computer executable instructions that when the software is executed operable to select a different pair of groups of the three or more groups to construct the cross branches when a cross branch exceeds the predetermined criteria after iterating over all potential variance node and check node pairs of the first and second groups.

15. The non-transitory computer readable storage media of claim 9, wherein the groups of information bits are modulated according to a 64 Quadrature Amplitude Modulation (QAM) symbol constellation, and at least one group of information bits correspond to inner symbols of the QAM symbol constellation and at least another group of information bits correspond to outer symbols of the QAM symbol constellation.

16. An apparatus comprising:
an encoder; and
a processor coupled to the encoder and configured to supply information bits to the encoded;
wherein the encoder is configured to:
   partition the information bits into at least two groups based on inherent reliability and immunity to channel impairments of the respective bits; and
   encode each of the groups of information bits with a different coding strength.
   parallelize Tanner graph representations of each of the groups of information bits to generate a composite Tanner graph representation;
   compute a number for cross branches between the groups of information bits based on average degrees of Tanner graph representations of each of the groups of information bits; and
   construct each cross branch by:
      connecting a first variable node of a first group of the at least two groups and a first check node of a second group of the at least two groups;
      computing a minimum girth of the composite Tanner graph representation;
      when the computed minimum girth of the composite Tanner graph representation satisfies a predetermined criteria, proceeding to construct a next cross branch; and
      when the computed minimum girth of the composite Tanner graph representation exceeds the predetermined criteria, proceeding to connecting a different pair of variable node of the first group and check node of the second group and computing the minimum girth again until the predetermined criteria is satisfied.

17. The apparatus of claim 16, wherein the encoder is configured to encode information bits for a low density parity code word such that a different coding strength is applied to different groups of information bits within a single code word.

18. The apparatus of claim 16, wherein the encoder is further configured to adjust the predetermined criteria when a cross branch exceeds the predetermined criteria after iterating over all potential variance node and check node pairs.

19. The apparatus of claim 16, wherein the at least two groups comprise three or more groups, and the encoder is further configured to select a different pair of groups of the three or more groups to construct the cross branches when a cross branch exceeds the predetermined criteria after iterating over all potential variance node and check node pairs of the first and second groups.

20. The apparatus of claim 16, wherein the groups of information bits are modulated according to a 64 Quadrature Amplitude Modulation (QAM) symbol constellation, and at least one group of information bits correspond to inner symbols of the QAM symbol constellation and at least another group of information bits correspond to outer symbols of the QAM symbol constellation.

* * * * *